(12) United States Patent
Williams et al.

(10) Patent No.: US 6,516,187 B1
(45) Date of Patent: Feb. 4, 2003

(54) DC OFFSET CORRECTION FOR DIRECT CONVERSION TUNER IC

(75) Inventors: Scott L. Williams, Tigard, OR (US); James W. H. Marsh, Sherwood, OR (US); Martin Tomasz, San Francisco, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/039,205

(22) Filed: Mar. 13, 1998

(51) Int. Cl.[7] .............................. H04B 1/10; H04B 1/26
(52) U.S. Cl. ...................... 455/313; 455/305; 455/306; 455/310; 455/317; 455/324; 455/296
(58) Field of Search .............................. 455/214, 234.1, 455/314, 324, 312, 296, 307, 310, 311, 317, 306, 305, 304, 258, 255

(56) References Cited

U.S. PATENT DOCUMENTS

| | | | |
|---|---|---|---|
| 3,304,508 A | 2/1967 | Danielsen et al. | 327/167 |
| 5,575,001 A * | 11/1996 | Ku | 455/192.1 |
| 5,724,653 A * | 3/1998 | Baker et al. | 455/296 |
| 5,898,912 A * | 4/1999 | Heck et al. | 455/234.2 |

FOREIGN PATENT DOCUMENTS

| | | | |
|---|---|---|---|
| DE | 33 46 725 | 7/1985 | H04L/25/06 |
| EP | 0 474 615 | 3/1992 | H04B/1/30 |
| EP | 0 719 013 | 6/1996 | H04L/25/06 |

* cited by examiner

Primary Examiner—Edward F. Urban
Assistant Examiner—Meless Zewdu
(74) Attorney, Agent, or Firm—Blakely, Sokoloff, Taylor & Zafman LLP

(57) ABSTRACT

The present invention discloses a method and apparatus for correcting the DC offset caused by self-conversion of the oscillator signal in an RF-to-baseband converter. The circuit comprises: a subtractor for subtracting an amplified DC offset signal from a filtered mixer signal to generate a corrected signal; a baseband amplifier coupled to the subtractor to receive the corrected signal to generate a baseband output signal; a low-pass filter coupled to the baseband amplifier to generate a DC offset signal representative of the DC offset; and a DC offset amplifier coupled to the low-pass filter and the subtractor to generate the amplified DC offset signal.

19 Claims, 3 Drawing Sheets

DC OFFSET CORRECTION FOR DIRECT CONVERSION TUNER IC

BACKGROUND OF THE INVENTION

1. Field of the Invention

The present invention relates to analog integrated circuits. In particular, the present invention relates to DC offset correction for direct baseband conversion.

2. Description of Related Art

The direct conversion of a radio frequency (RF) signal to a baseband signal in a receiver system typically uses a mixer to multiply the RF signal by a signal from a local oscillator (LO) operating at a frequency close to the RF frequency.

A mixer is basically a multiplier which generates a signal with frequency components at the difference and sum frequencies. Mixing is achieved by applying the RF signal and the LO signal to a non-linear element, which can be a diode or a transistor. There are many types of mixers: single-ended, balanced or anti-parallel, double balanced, and double-double balanced. The selection of a proper mixer requires a trade-off between isolation performance and low conversion loss.

When the receiver is implemented in a single tuner integrated circuit (IC), the LO signal tends to leak into the RF input port of the tuner IC. This leakage causes self mixing of the local oscillator, which is translated into a large DC offset at the mixer output. This tends to drive the baseband amplifier out of its dynamic range, causing distortion to the desired baseband signals.

The DC offset may be filtered out by a high pass filter or a bandpass filter at the mixer output. However, such a filter usually has to have a sharp roll-off frequency response to maintain the quality of the baseband output signal. The design of such a sharp roll-off filter is complex and expensive, and further would require large value components which would not be suitable for monolithic implementation, and thus is not suitable for implementation in a single tuner IC.

Therefore, it is desirable to have a method and apparatus to provide a DC offset correction in direct baseband converter.

SUMMARY OF THE INVENTION

The present invention discloses a method and apparatus for correcting the DC offset caused by self-conversion of the oscillator signal in an RF-to-baseband converter. The circuit comprises: a subtractor for subtracting an amplified DC offset signal from a filtered mixer signal to generate a corrected signal; a baseband amplifier coupled to the subtractor to receive the corrected signal to generate a baseband output signal; a low-pass filter coupled to the baseband amplifier to generate a DC offset signal representative of the DC offset; and a DC offset amplifier coupled to the low-pass filter and the subtractor to generate the amplified DC offset signal.

BRIEF DESCRIPTION OF THE DRAWINGS

The objects, features and advantages of the present invention will become apparent from the following detailed description of the present invention in which.

DESCRIPTION OF THE PRESENT INVENTION

The present invention discloses a method and apparatus for providing a DC offset correction in an RF-to-baseband converter. The apparatus includes a feedback circuit having a lowpass filter and a DC feedback amplifier. The lowpass filter attenuates the desired baseband signal components and the DC feedback amplifier provides subtraction of the DC component. The baseband amplifier therefore operates in its full dynamic range.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

Figure 1:
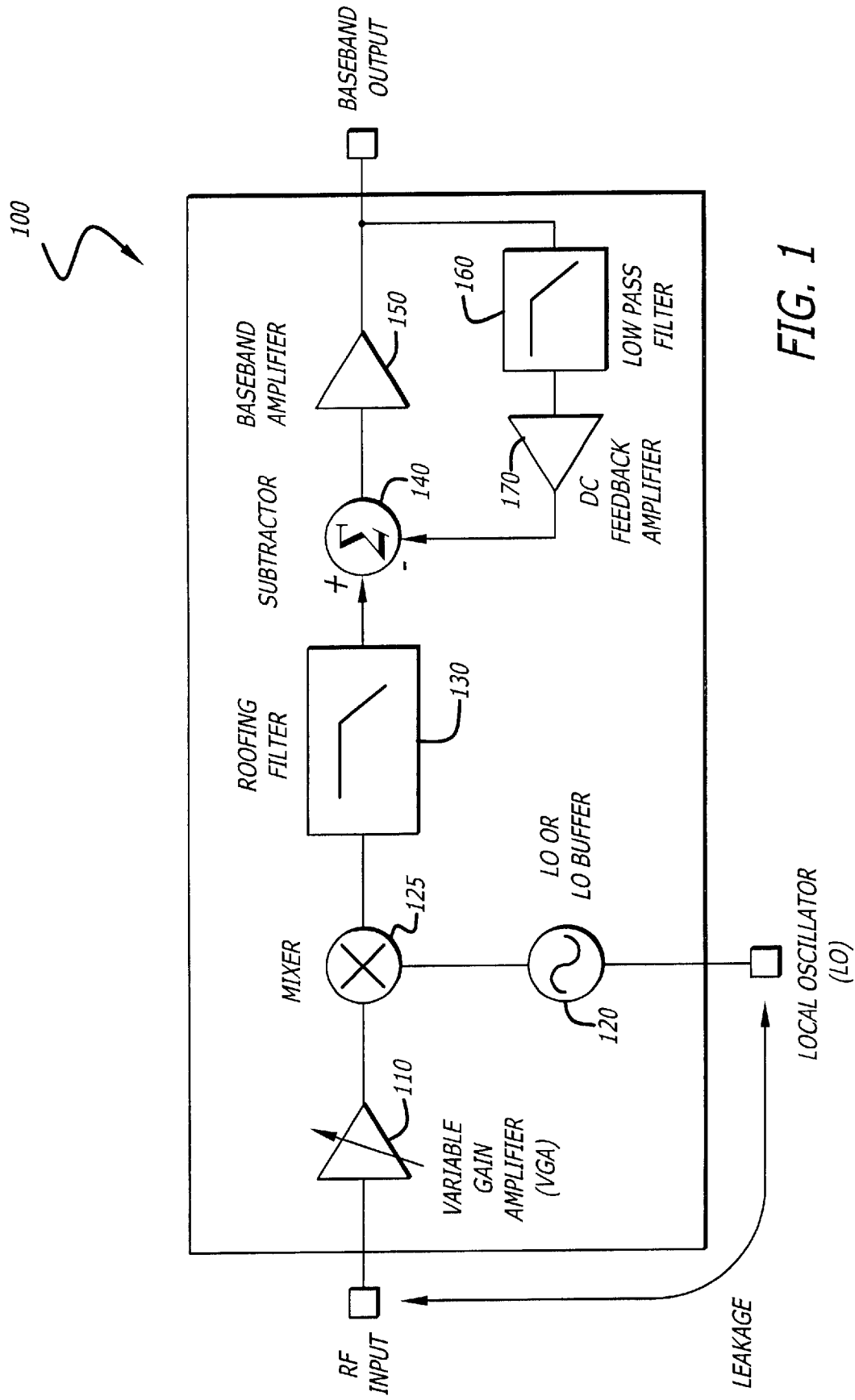
FIG. 1 is a block diagram of one embodiment of an RF-to-baseband conversion subsystem using DC offset correction in accordance with the teachings of the present invention.

FIG. 1 is a block diagram of one embodiment of an RF-to-baseband conversion subsystem 100 using DC offset correction in accordance with the teachings of the present invention. Subsystem 100 includes a variable gain amplifier (VGA) 110, a local oscillator (LO) 120, a mixer 125, a roofing filter 130, a subtractor 140, a baseband amplifier 150, a feedback lowpass filter 160, and a DC feedback amplifier 170.

The VGA 110 receives the RF input signal and amplifies the signal at a variable gain. The VGA 110 is designed to operate within the RF frequency range. In one embodiment, the frequency range is from 950 MHz to 2050 MHz. The gain is adjusted according to the RF input power. For low RF input power, the VGA 110 operates at a large gain such that the baseband output delivers a full scale level. For high RF input power, the VGA 110 operates at a small gain to avoid saturation at the baseband amplifier.

The LO 120 provides a signal at close to the RF frequency range. In one embodiment, the LO operates with an external resonator having a frequency range of 950 MHz to 2050 MHz. Due to the self mixing of the LO ($f_{LO}-f_{LO}$), the LO leakage will translate to a large DC offset component at the mixer output. This large DC offset will be corrected by the DC offset correction circuit.

The mixer 125 receives the output of the VGA 110 and the output of the LO 120. Let fRF and fLo be the frequency of the RF input signal and the LO signal. The mixer 125 essentially combines the RF input signal and the LO signal together to generate a mixer signal having the frequency components at $f_{RF}-f_{LO}$ and $f_{RF}+f_{LO}$. The low frequency component $f_{RF}-f_{LO}$ represents the baseband signal and the high frequency component $f_{RF}+f_{LO}$ will be filtered out by the roofing filter 130. As discussed earlier, the self mixing of the LO introduces a large DC component at the mixer output.

The roofing filter 130 filters out the high frequency components caused by the mixing of the RF signal and the LO signal, while retaining the baseband signal components. The output of the roofing filter 130 goes to the subtractor 140.

The subtractor 140 subtracts the feedback DC signal from the output of the roofing filter 130 to produce the desired baseband signal. The desired baseband signal is then amplified by the baseband amplifier 150 to produce the baseband output signal. The output of the baseband amplifier 150 is fedback to the lowpass filter 160.

The lowpass filter 160 essentially passes the DC component in the baseband signal which will be subtracted at the subtractor 140. The lowpass filter 160 is designed to ensure that the desired baseband signal is attenuated and therefore will not be subtracted out. The lowpass filter 160 may be implemented on chip, off chip, or a combination of both on-chip and off-chip.

The DC feedback amplifier 170 receives and amplifies the output of the lowpass filter 160. This output contains mostly the DC offset component caused by the self mixing of the LO 120. Therefore, when this amplified output is subtracted from the output of the roofing filter 130, the resulting signal will contain the desired baseband signal.

The self conversion of the LO may vary with frequency (e.g., channel selection) but the effect is fairly constant. At most the DC offset level may be slowly drifting. Overall, the response of the DC offset correction by the feedback circuit is slow, particularly in comparison with the typical RF input signal. Therefore, the signal quality remains unaffected over the range of frequency.

Figure 2:
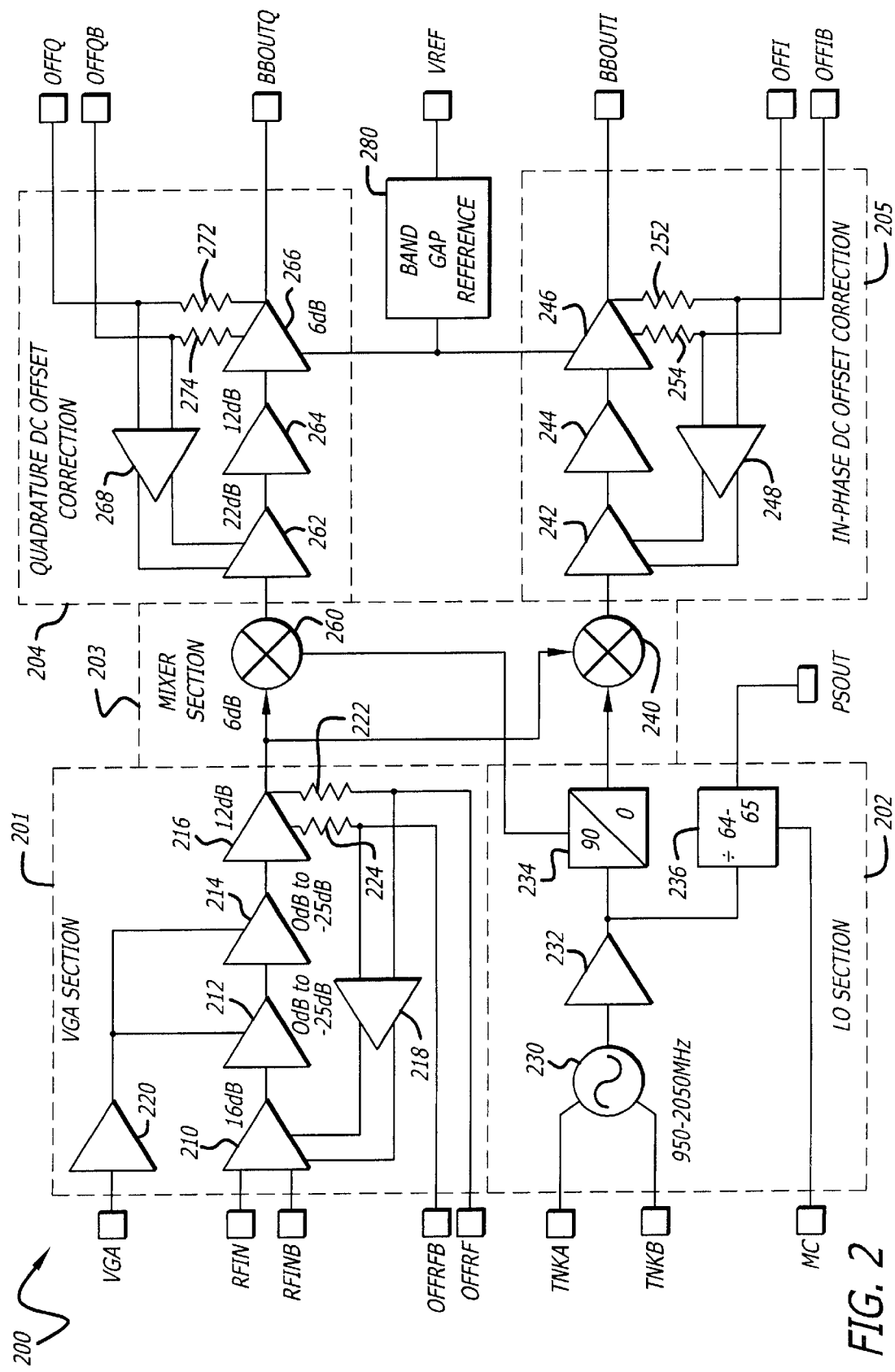
FIG. 2 is a circuit diagram of one embodiment of an RF-to-baseband conversion subsystem using the DC offset correction that operates in accordance with the teachings of the present invention.

FIG. 2 is a circuit diagram of one embodiment of an RF-to-baseband conversion subsystem 200 using the DC offset correction that operates in accordance with the teachings of the present invention. The subsystem 200 includes a Variable Gain Amplifier (VGA) section 201, a Local Oscillator (LO) section 202, a mixer section 203, a quadrature DC offset correction section 204, and an in-phase DC offset correction section 205.

The VGA section 201 includes amplifiers 210, 212, 214, 216, and 218, and resistors 222 and 224. All the amplifiers are designed to operate within the frequency range of the RF input signal. In one embodiment, the frequency range is 950 to 2050 MHz. The differential amplifier 210 receives the non-inverting and inverting RF inputs RFIN and RFINB. The cascading amplifiers 212 and 214 are controlled by the amplifier 220. The amplifier 216 provides additional gain. Resistors 222 and 224 provide signal paths for the offset correction inputs OFFRF and OFFRFB. The feedback amplifier 218 provides offset adjustment to the amplifier 210. The VGA control signal is gated by the amplifier 220 which in turn provides gain control to the amplifiers 212 and 214. In one embodiment, the gains provided by the amplifiers 210, 212, 214, and 216 are 16dB, 0db to −25dB, 0db to −25dB, and 12dB, respectively.

The LO section 202 includes an oscillator 230, an amplifier 232, a phase splitter 234, and a frequency divider 236. The oscillator 202 receives the two oscillator resonator port inputs TNKA and TNKB. The frequency range of the oscillator is designed to be compatible with the RF input frequency range. In one embodiment, this oscillator frequency range is 950 to 2050 MHz. The amplifier 232 provides additional gain and buffering to the oscillator output. The phase splitter 234 generates two components from the oscillator signal. One is the in-phase (I) component which has a zero phase shift with respect to the oscillator signal. The other is the quadrature (Q) component which has a 90-degree phase shift with respect to the oscillator signal. Both of these components are each mixed with the input RF signal to provide two baseband output signals having a 90-degree phase shift between them. The frequency divider 236 generates a prescaler output (PSOUT) signal whose frequency is a divide-by-N frequency from the oscillator frequency. In one embodiment, the value of N is selectable from two integer numbers: 64 and 65. The selection is controlled by a prescaler modulus control (MC) input.

The mixer section 203 includes two mixers 240 and 260. The mixer 240 receives the two signals: the output of the VGA section 201 and the in-phase component from the LO section 202. The mixer 240 combines these two signals and generates a signal having the baseband in-phase component. Similarly, the mixer 260 receives the two signals: the output of the VGA section 201 and the quadrature component from the LO section 202. The mixer 240 combines these two signals and generates a signal having the baseband quadrature component.

The in-phase DC offset correction section 205 includes the DC offset circuitry which comprises amplifiers 242, 244, 246, and 248, and resistors 252 and 254. Amplifiers 242 operates as a subtractor to subtract the feedback DC amplifier output from the output of the in-phase mixer 240. Amplifier 244 provides the gain and buffering for the DC offset corrected in-phase baseband signal. Amplifier 246 provides the signal conditioning and scale the output to within a predetermined operational range. In one embodiment, this voltage range is from 2.3V to 2.6V. Resistors 252 and 254 and the feedback amplifier 248 form a lowpass filter and amplifier to allow any residual DC component to pass through. This DC offset is subtracted from the mixer output by the amplifier 242. The two inputs OFFI and OFFIB provide external control for the desired DC offset correction. The final output signal is BBOUTI.

The quadrature DC offset correction section 204 operates in the similar manner as the in-phase section 205. It includes the DC offset circuitry comprising amplifiers 262, 264, 266, and 268, and resistors 272 and 274. Amplifiers 262 operates as a subtractor to subtract the feedback DC amplifier output from the output of the quadrature mixer 260. Amplifier 264 provides the gain and buffering for the DC offset corrected quadrature baseband signal. Amplifier 266 provides the signal conditioning and scale the output to within a predetermined operational range. In one embodiment, this voltage range is from 2.3V to 2.6V. Resistors 272 and 274 and the feedback amplifier 268 form a lowpass filter and amplifier to allow any residual DC component to pass through. This DC offset is subtracted from the mixer output by the amplifier 262. The two inputs OFFQ and OFFQB provide external control for the desired DC offset correction. The final output signal is BBOUTQ.

The bandgap reference 280 provides a reference voltage to the amplifiers 246 and 266 to generate the baseband output signals within the desired voltage range. The bandgap reference 280 has the reference input signal $V_{REF}$. In one embodiment, the $V_{REF}$ input is 1.2V.

Figure 3:
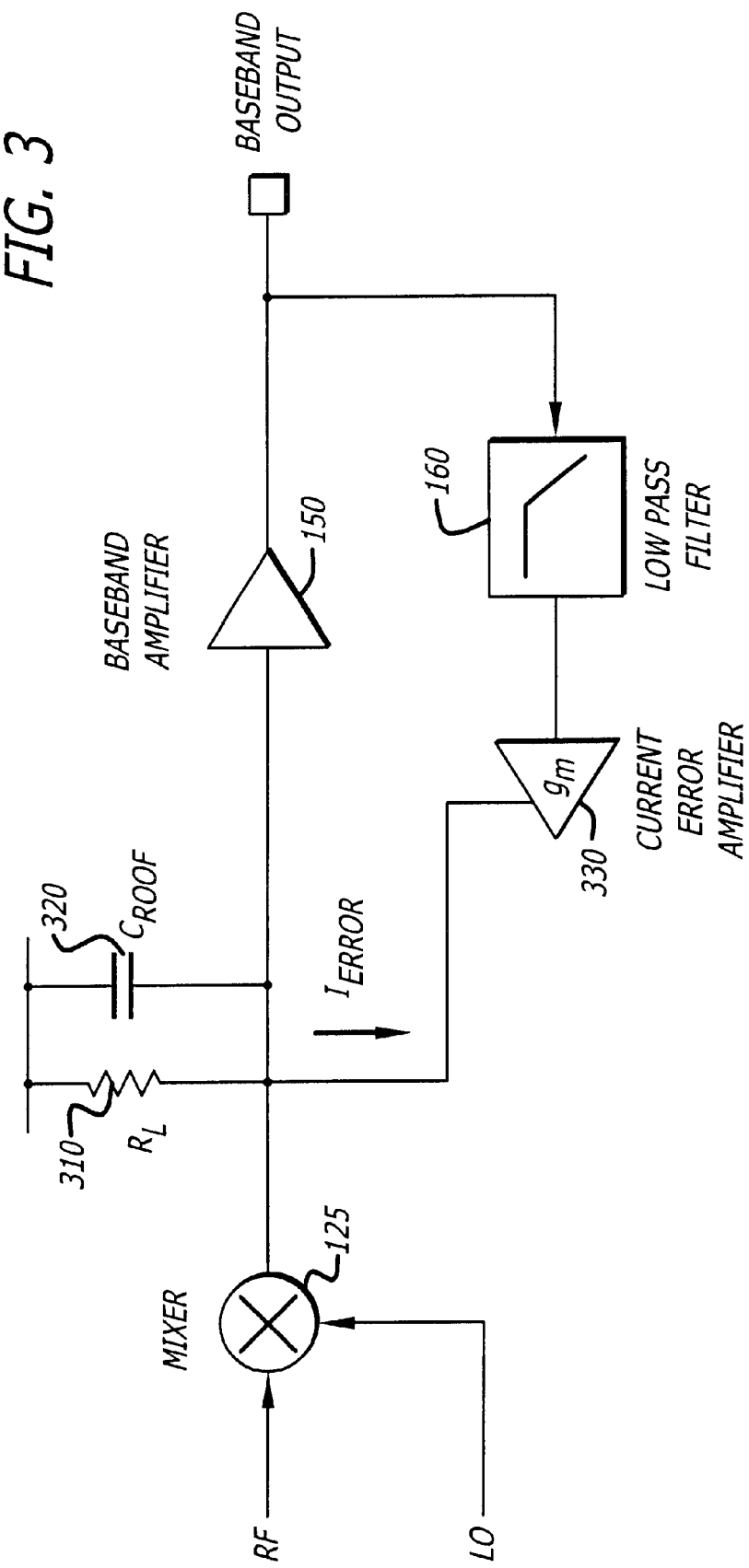
FIG. 3 is a circuit diagram of one embodiment of a DC offset correction circuit using an error current amplifier.

FIG. 3 is a diagram illustrating another embodiment of a DC offset correction circuit 300. The correction circuit 300 includes a mixer 125, a load resistor $R_L$ 310, a roof filter capacitor $C_{ROOF}$ 320, a baseband amplifier 150, a feedback lowpass filter 160, and an error current amplifier (the $g_m$ stage) 330.

The embodiment shown in FIG. 3 is similar to the embodiment shown in FIGS. 1 and 2, except that an error current amplifier is used and the subtraction is done at the output of the mixer. Correcting the DC offset directly at the output of the mixer, rather than embedding with the baseband amplifier, has an advantage of raising the dynamic range of mixer output. Therefore, the baseband amplifier 150 can operate at its linear region producing a better quality baseband output.

The DC offset correction circuitry therefore eliminates the undesirable DC offset caused by the leakage from the self-mixing effect of the local oscillator. The correction circuitry is simple with a feedback mechanism to subtract the DC offset from the baseband signal. The result is a high quality baseband signal.

While the invention has been described with reference to an illustrative embodiment, this description is not intended to be construed in a limiting sense. Various modifications of the illustrative embodiment, as well as other embodiments of the invention, which are apparent to persons skilled in the art to which the invention pertains, are deemed to lie within the spirit and scope of the invention.

What is claimed is:

1. A circuit comprising:
   an error current amplifier to subtract an amplified DC offset signal from a filtered mixer signal to generate a corrected signal;
   a baseband amplifier coupled to the error current amplifier to receive the corrected signal, the baseband amplifier having an output generating a baseband output signal;
   a low-pass filter coupled to the output of the baseband amplifier in a feedback path to filter the baseband output signal, the low pass filter generating a DC offset signal representative of a direct current (DC) offset, the DC offset being caused by a self-conversion of an oscillator in a baseband converter; and
   a DC offset amplifier coupled to the low-pass filter and the error current amplifier to generate the amplified DC offset signal.

2. The circuit of claim 1 wherein the error current amplifier adjusts the filtered mixer signal based on an error current generated by the DC offset amplifier.

3. The circuit of claim 2 wherein the DC offset amplifier is an error current amplifier.

4. The circuit of claim 1 further comprises:
   a variable gain amplifier (VGA) that receives an input signal and generates an amplified input signal;
   a mixer coupled to the VGA and the oscillator to generate a mixer output signal; and
   a roofing filter coupled to the mixer to receive the mixer output signal, the roofing filter generating the filtered mixer signal.

5. The circuit of claim 4 wherein the input signal has a frequency range of 950 MHz to 2050 MHz.

6. The circuit of claim 4 wherein the oscillator has a frequency range of 950 MHz to 2050 MHz.

7. The circuit of claim 1 wherein the self-conversion is caused by a leakage of the oscillator.

8. An apparatus comprising:
   a variable gain amplifier (VGA) circuit to receive an input signal, the VGA generating an amplified input signal;
   a local oscillator (LO) circuit to generate a first oscillator output signal;
   a mixer circuit coupled to the VGA circuit and the LO circuit to generate a first mixer output signal; and
   a first direct current (DC) offset correction circuit coupled to the mixer circuit to correct the DC offset using a DC offset signal representative of the DC offset, the DC offset being caused by a self-conversion of the local oscillator circuit, the first DC offset correction circuit comprising:
      a first error current amplifier to subtract a first amplified DC offset signal from a first filtered mixer signal to generate a first corrected signal,
      a first baseband amplifier coupled to the first error current amplifier to receive the first corrected signal, the baseband amplifier having an output generating a first baseband output signal,
      a first low-pass filter coupled to the output of the first baseband amplifier to filter the first baseband output signal, the first low pass filter generating a first DC offset signal representative of the DC offset, and
      a first DC offset amplifier coupled to the first low pass filter and the first error current amplifier to generate the first amplified DC offset signal.

9. The apparatus of claim 8 wherein the local oscillator further comprises a phase splitter to generate a second oscillator output signal, the second oscillator output signal having a phase shift from the first oscillator output signal.

10. The apparatus of claim 9 wherein the phase shift is 90 degrees.

11. The apparatus of claim 9 further comprises a second direct current (DC) offset correction circuit which is coupled to the mixer circuit for correcting the DC offset caused by the self-conversion of the local oscillator circuit.

12. The apparatus of claim 11 wherein the second DC offset correction circuit further comprises:
   a second error current amplifier to subtract a second amplified DC offset signal from a second filtered mixer signal to generate a second corrected signal;
   a second baseband amplifier coupled to the second error current amplifier to receive the second corrected signal to generate a second baseband output signal;
   a second low-pass filter coupled to the second baseband amplifier to generate a second DC offset signal representative of the DC offset; and
   a second DC offset amplifier coupled to the second low-pass filter and the second error current amplifier to generate the second amplified DC offset signal.

13. A method comprising:
   subtracting an amplified DC offset signal from a filtered mixer signal to generate a corrected signal using an error current amplifier;
   generating a baseband output signal from the corrected signal at an output of a baseband amplifier;
   low-pass filtering the baseband output signal at the output of the baseband amplifier in a feedback path to generate a DC offset signal representative of a direct current (DC) offset, the DC offset being caused by a self-conversion of an oscillator in a baseband converter; and
   amplifying the DC offset signal to generate the amplified DC offset signal.

14. The method of claim 13 wherein subtracting adjusts the filtered mixer signal based on an error current generated by the DC offset amplifier.

15. The method of claim 14 wherein the DC offset amplifier is an error current amplifier.

16. The method of claim 13 further comprises:
   receiving an input signal;
   generating an amplified input signal by a variable gain amplifier (VGA) from the received input signal;
   mixing the amplified input signal with an output of the oscillator to generate a mixer output signal; and
   filtering the mixer output signal to generate the filtered mixer signal.

17. The method of claim 13 wherein the input signal has a frequency range of 950 MHz to 2050 MHz.

18. The method of claim 13 wherein the oscillator has a frequency range of 950 MHz to 2050 MHz.

19. The method of claim 13 wherein the self-conversion is caused by a leakage of the oscillator.

* * * * *